US009820404B1

(12) United States Patent
Wu et al.

(10) Patent No.: US 9,820,404 B1
(45) Date of Patent: Nov. 14, 2017

(54) SLOT ASSEMBLY AND WORKPIECE

(71) Applicant: ELITEGROUP COMPUTER SYSTEMS CO.,LTD., Taipei (TW)

(72) Inventors: Jiun-Kai Wu, Taipei (TW); Chi-Ming Chung, Taipei (TW)

(73) Assignee: ELITEGROUP COMPUTER SYSTEMS CO., LTD., Taipei (TW)

( * ) Notice: Subject to any disclaimer, the term of this patent is extended or adjusted under 35 U.S.C. 154(b) by 0 days.

(21) Appl. No.: 15/414,521

(22) Filed: Jan. 24, 2017

(30) Foreign Application Priority Data

Dec. 2, 2016 (TW) .............................. 105218503 U

(51) Int. Cl.
*H05K 7/14* (2006.01)
(52) U.S. Cl.
CPC ......... *H05K 7/1461* (2013.01); *H05K 7/1427* (2013.01)
(58) Field of Classification Search
None
See application file for complete search history.

(56) References Cited

U.S. PATENT DOCUMENTS

| 4,941,841 | A | * | 7/1990 | Darden | G06F 1/184 361/679.39 |
| 5,126,899 | A | * | 6/1992 | Kanazawa | G11B 17/0438 360/96.51 |
| 5,216,558 | A | * | 6/1993 | Griffith | G11B 17/035 360/99.02 |
| 5,577,014 | A | * | 11/1996 | Kawamura | G11B 17/043 360/99.06 |
| 5,587,854 | A | * | 12/1996 | Sato | G11B 33/08 360/97.11 |
| 5,666,343 | A | * | 9/1997 | Ahn | G11B 17/0436 360/99.02 |
| 5,825,616 | A | * | 10/1998 | Howell | G06F 1/1616 361/679.38 |
| 5,901,129 | A | * | 5/1999 | Takahashi | G11B 17/047 360/99.06 |
| 6,002,660 | A | * | 12/1999 | Ikegame | G11B 17/0436 360/99.06 |
| 6,009,061 | A | * | 12/1999 | Davis | G11B 11/10543 720/632 |
| 6,011,687 | A | * | 1/2000 | Gluskoter | G06F 1/1632 361/679.41 |
| 6,047,599 | A | * | 4/2000 | Krajec | G01N 22/00 248/636 |

(Continued)

*Primary Examiner* — Xanthia C Cunningham
(74) *Attorney, Agent, or Firm* — Maschoff Brennan

(57) ABSTRACT

A slot assembly includes a base, a tray and a fastener. The base has an accommodating space having an opening end. The tray is movably located in the accommodating space. The tray has a bearing surface and is movable between a removed position and an inserted position. The tray is moved from the removed position to the inserted position by being pushed by a workpiece. The fastener is movably disposed on the tray. When the tray is at the removed position, the fastener is at a released position, and a second engaging portion of the fastener is located away from the bearing surface and detached from the first engaging portion. When the tray is at the inserted position, the fastener is at a fixed position, and the second engaging portion of the fastener is located close to the bearing surface and fixed to the first engaging portion.

14 Claims, 14 Drawing Sheets

(56) References Cited

U.S. PATENT DOCUMENTS

| | | | | |
|---|---|---|---|---|
| 6,069,789 | A * | 5/2000 | Jung | G06F 1/184 312/223.2 |
| 6,111,196 | A * | 8/2000 | Arai | G11B 17/056 174/50 |
| 6,285,643 | B1 * | 9/2001 | Arai | G11B 17/047 720/732 |
| 6,315,587 | B1 * | 11/2001 | Ikemoto | H01R 13/24 361/726 |
| 6,510,051 | B2 * | 1/2003 | Kim | G06F 1/1632 312/223.2 |
| 6,570,841 | B1 * | 5/2003 | Nakashima | G11B 17/043 720/731 |
| 6,587,348 | B2 * | 7/2003 | Kondo | G06K 7/0047 361/728 |
| 7,310,804 | B2 * | 12/2007 | Bae | G11B 17/047 720/610 |
| 7,529,084 | B2 * | 5/2009 | Liao | G11B 17/043 361/679.39 |
| 7,739,701 | B1 * | 6/2010 | Hertrich | G11B 17/0405 720/635 |
| 8,264,843 | B2 * | 9/2012 | Lee | H04B 1/3816 361/737 |
| 8,867,202 | B2 * | 10/2014 | Williams | G06F 1/1632 361/679.41 |
| 8,902,602 | B2 * | 12/2014 | Wang | H05K 7/1461 361/737 |
| 2005/0028180 | A1 * | 2/2005 | Hertrich | G11B 17/047 720/633 |
| 2012/0057292 | A1 * | 3/2012 | Ulrich | G06F 1/187 361/679.32 |
| 2015/0022981 | A1 * | 1/2015 | Tan | G06K 7/0021 361/756 |

* cited by examiner

SLOT ASSEMBLY AND WORKPIECE

CROSS-REFERENCE TO RELATED APPLICATIONS

This non-provisional application claims priority under 35 U.S.C. §119(a) on Patent Application No(s). 105218503 filed in Taiwan, R.O.C. on Dec. 2, 2016, the entire contents of which are hereby incorporated by reference.

TECHNICAL FIELD

The disclosure relates to a slot assembly and a workpiece, more particularly to a slot assembly having a fastener and a workpiece having an engaging portion.

BACKGROUND

In recent years, the developments of various electronic devices make our lives become more convenient, and people have more and more diverse requirements on the electronic devices. Accordingly, electronic device manufacturers start to use the electronic devices to be inserted with an expansion card having specific function in order to meet the said diverse requirements on the electronic devices. There are many types of expansion cards that can be inserted into the electronic device in order to provide expanded capability to the electronic device.

SUMMARY

The present disclosure provides a slot assembly in order to strengthen the connection between the slot assembly and the workpiece.

One embodiment of the disclosure provides a slot assembly configured to be inserted by a workpiece. The slot assembly includes a base, a tray and a fastener. The base has an accommodating space. The accommodating space has an opening end. The workpiece is configured to be inserted into or removed from the accommodating space through the opening end. The tray is movably disposed on the base and located in the accommodating space. The tray has a bearing surface for bearing the workpiece. The tray is movable between a removed position and an inserted position. The tray is relatively close to the opening end when the tray is at the removed position. The tray is relatively away from the opening end when the tray is at the inserted position. The tray is moved from the removed position to the inserted position by being pushed by the workpiece. The fastener is movably disposed on the tray. The fastener has a second engaging portion. When the tray is at the removed position, the fastener is at a released position, and the second engaging portion of the fastener is located away from the bearing surface with respect to the tray and detached from the first engaging portion. When the tray is at the inserted position, the fastener is at a fixed position, and the second engaging portion of the fastener is located close to the bearing surface with respect to the tray and fixed to the first engaging portion.

One embodiment of the disclosure provides a workpiece having a first surface, a second surface parallel to the first surface, a side surface inclined with respect to the first surface and the second surface, and an engaging portion, wherein the engaging portion is a recess located on the side surface.

BRIEF DESCRIPTION OF THE DRAWINGS

The present disclosure will become better understood from the detailed description given hereinbelow and the accompanying drawings which are given by way of illustration only and thus are not limitative of the present disclosure and wherein.

DETAILED DESCRIPTION

Figure 1:
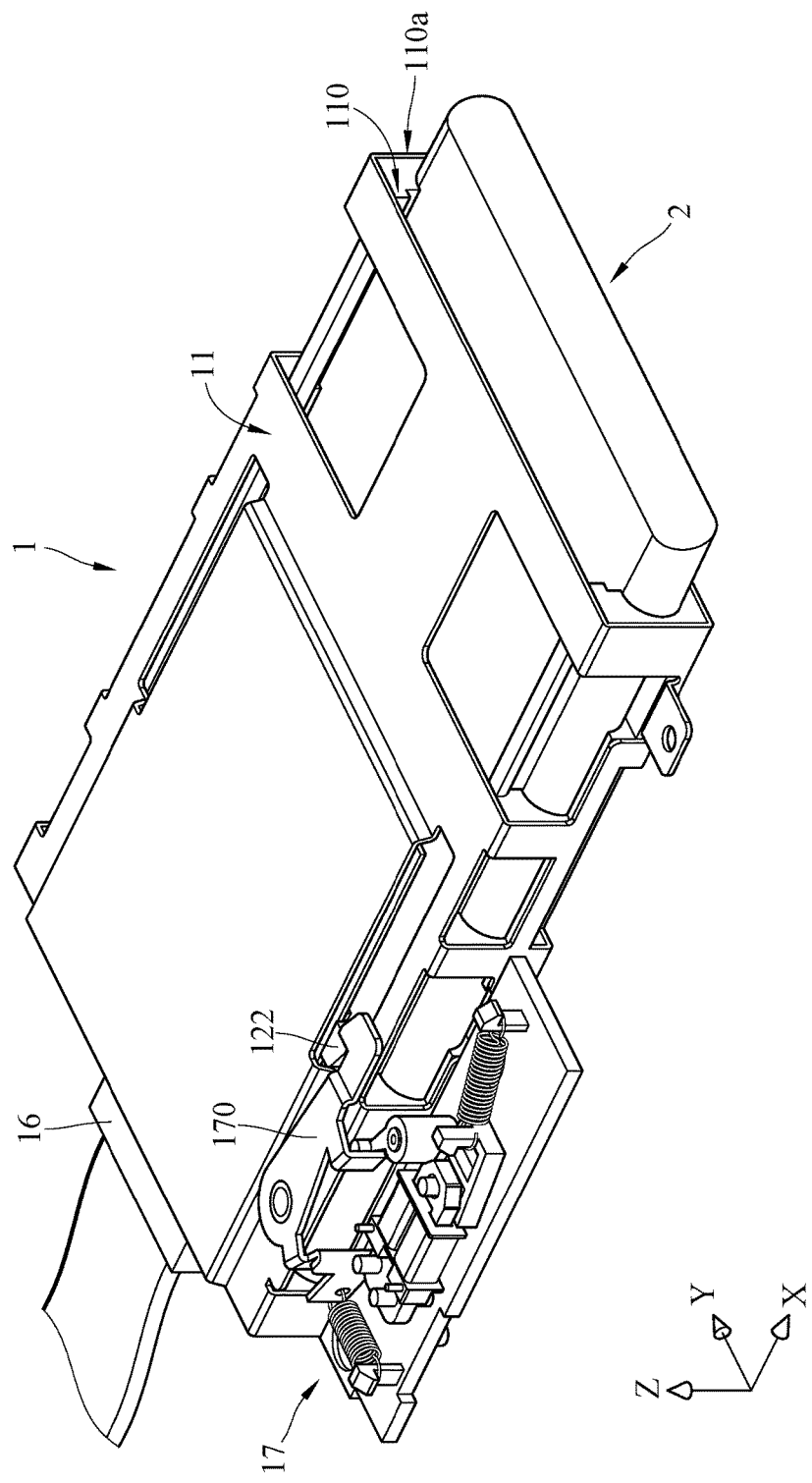
FIG. 1 is a perspective view of a slot assembly and a workpiece according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The drawings may not be drawn to actual size or scale, some exaggerations may be necessary in order to emphasize basic structural relationships, while some are simplified for clarity of understanding, and the present disclosure is not limited thereto. It is allowed to have various adjustments under the spirit of the present disclosure. In the specification, the term "on" may be described as "one is located above another" or "one is in contact with another". In addition, the terms "top side", "bottom side", "above" and "below" are used to illustrate but limit the present disclosure. The term "substantially" is referred to the complete or nearly complete extent or degree of a structure, which means that it is allowable to have tolerance during manufacturing.

Figure 2:
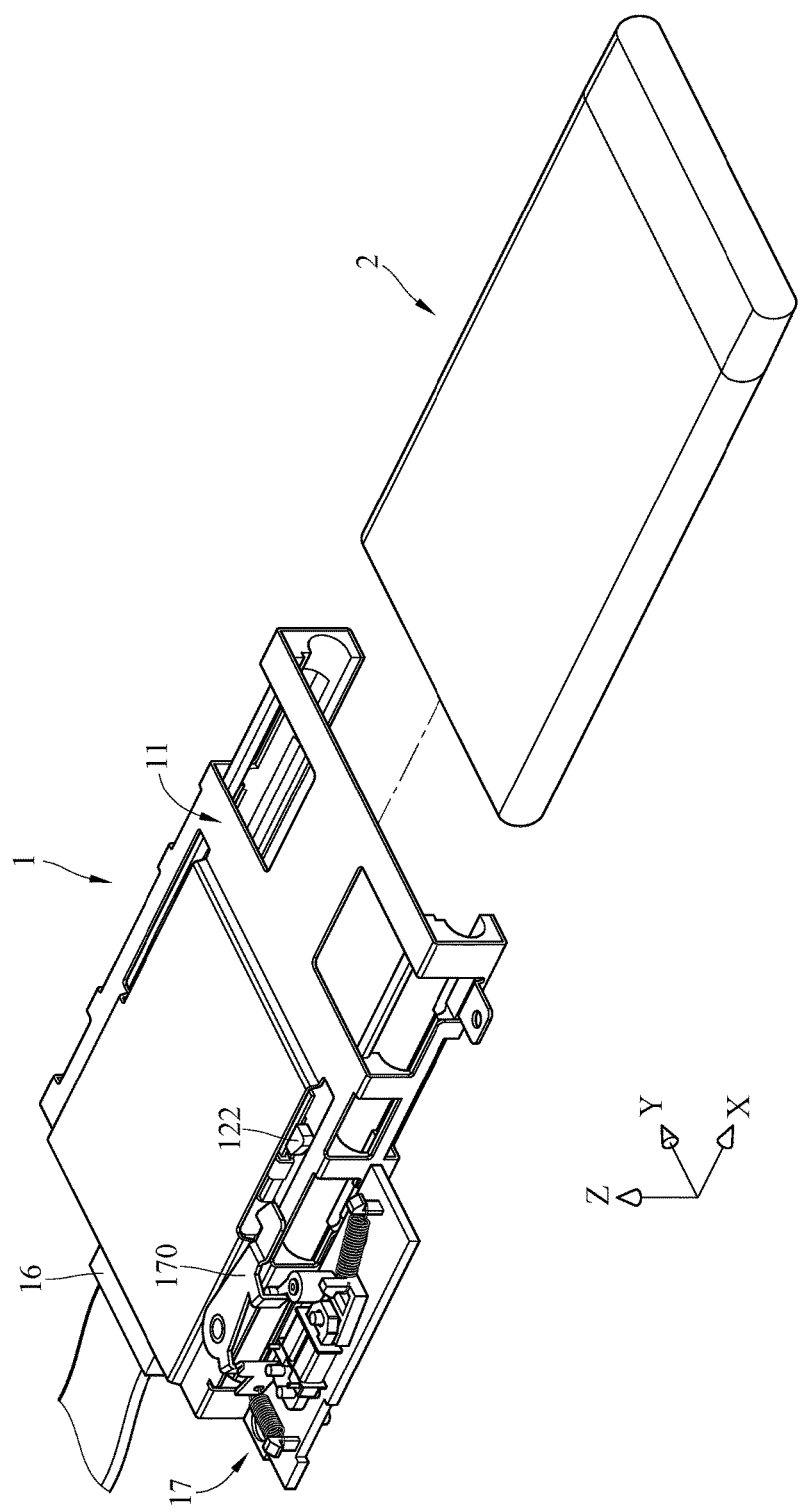
FIG. 2 is an exploded view of the slot assembly and the workpiece in FIG. 1.
Figure 3A:
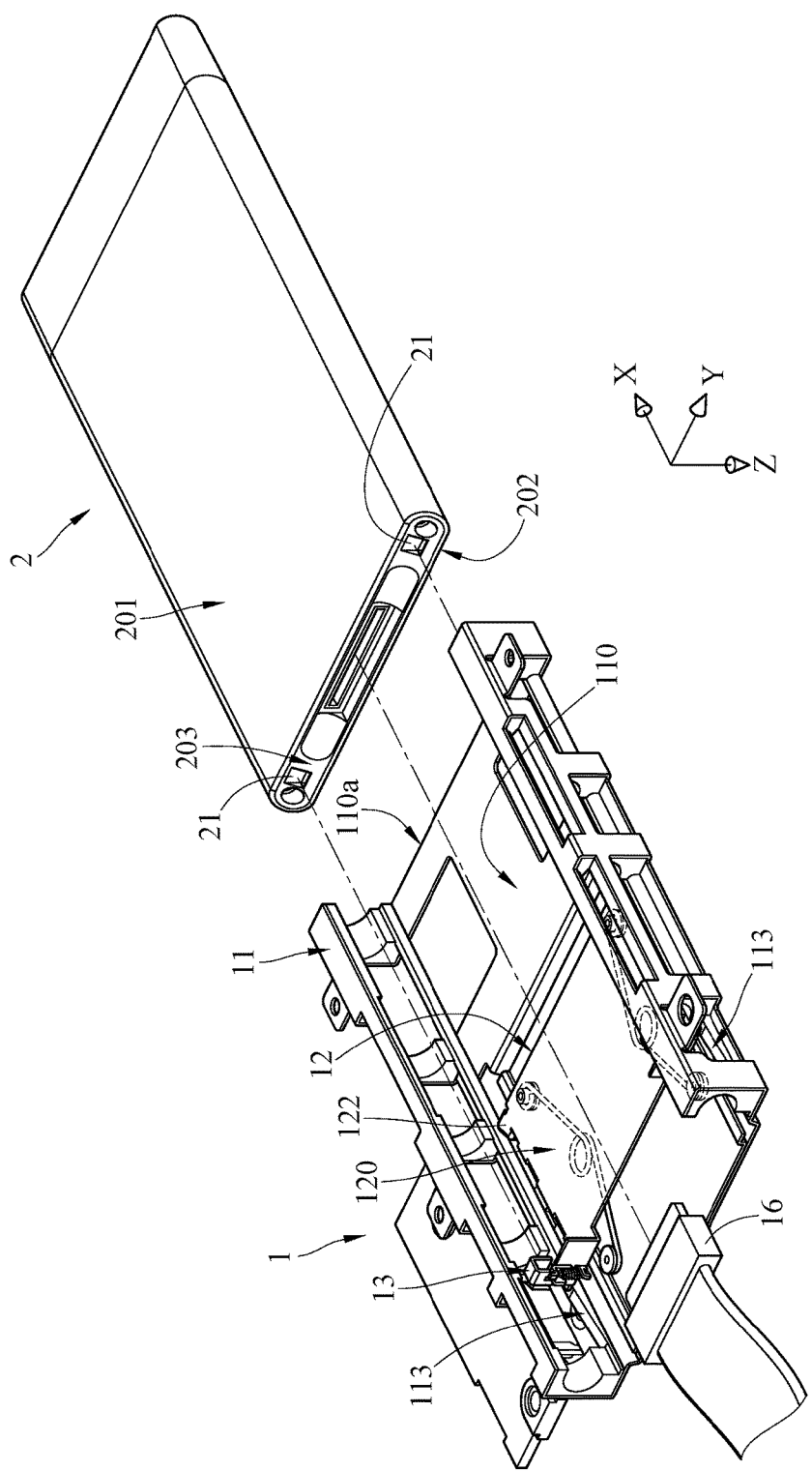
FIG. 3A is another exploded view of the slot assembly and the workpiece in FIG. 1.
Figure 3B:
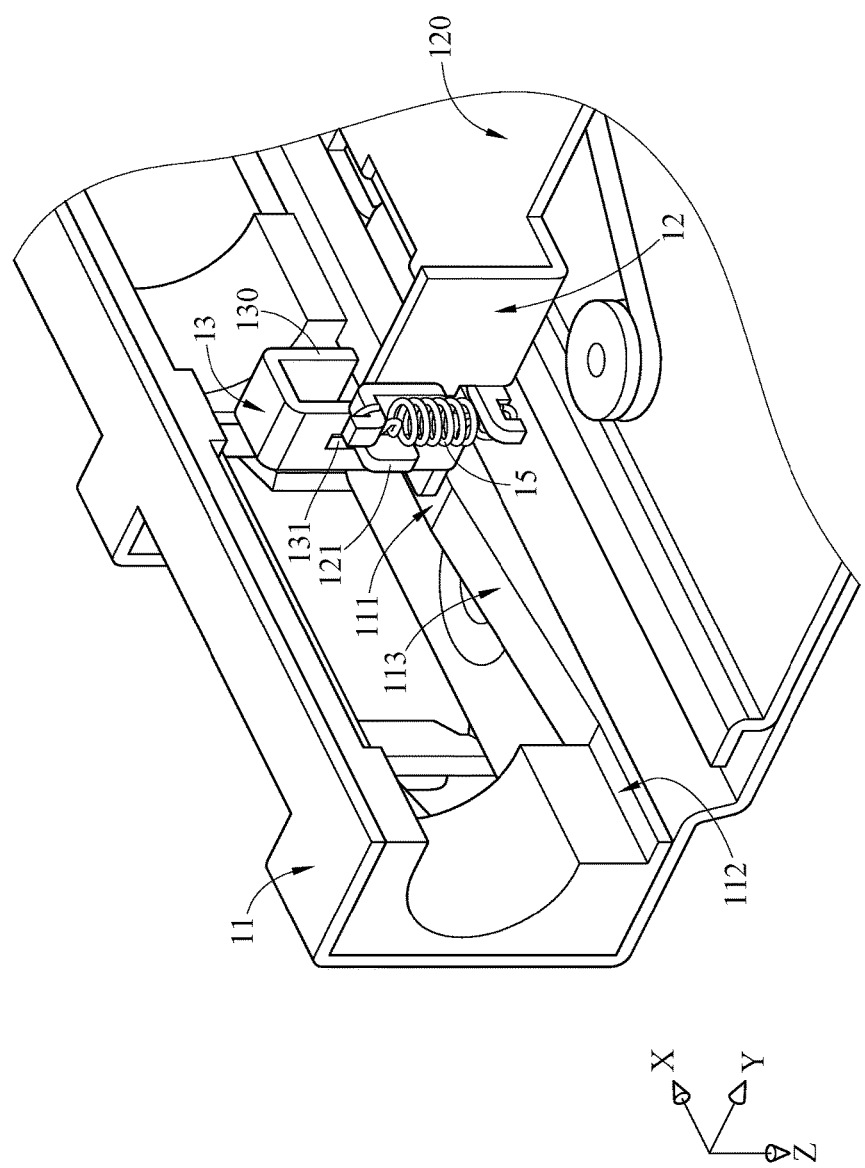
FIG. 3B is a partial enlarged view of the slot assembly in FIG. 3A.

Please refer to FIG. 1, FIG. 2, FIG. 3A and FIG. 3B, FIG. 1 is a perspective view of a slot assembly 1 and a workpiece 2 according to one embodiment of the disclosure, FIG. 2 is an exploded view of the slot assembly 1 and the workpiece 2 in FIG. 1, FIG. 3A is another exploded view of the slot assembly 1 and the workpiece 2 in FIG. 1, FIG. 3B is a partial enlarged view of the slot assembly 1 in FIG. 3A. The slot assembly 1 is disposed in an electronic device, and is configured to be inserted by the workpiece 2. The workpiece 2 has two first engaging portions 21, a first surface 201 and a second surface 202. The first surface 201 and the second surface 202 are parallel to each other. The workpiece 2 further has a side surface 203 which is inclined with respect to the first surface 201 and the second surface 202. The first engaging portions 21 are located on the side surface 203, and each of the first engaging portions 21 is a recess, but the present disclosure is not limited thereto. In some embodiments, the first engaging portion may be in a hook shape according to actual requirements. The workpiece 2 is, for example, an expansion card such as a computer card, a memory card, a SIM card or a SD card.

In this embodiment, the slot assembly 1 includes a base 11, a tray 12, two fasteners 13, two elastic members 14, two elastic members 15, a connection port 16 and a switch mechanism 17. As shown in the drawings, only one of the fasteners 13 and one of the elastic members 15 are drawn, and the other fastener 13 and the other elastic member 15 are covered by the base 11, so only one of the fasteners 13 and one of the elastic members 15 are illustrated in the following paragraphs.

The base 11 is disposed on a case of the electronic device. The base 11 has an accommodating space 110. The accommodating space 110 has an opening end 110a. The workpiece 2 is able to be inserted into or removed from the accommodating space 110 via the opening end 110a. The base 11 has two first contact surfaces 111, two guiding surfaces 113 and two second contact surfaces 112. As shown in the drawings, only one of the first contact surfaces 111 and one of the second contact surface 112 are drawn, and the other first contact surface 111 and the other second contact surface 112 are covered by the base 11, so only one of the first contact surfaces 111 and one of the second contact surfaces 112 are illustrated in the following paragraphs. The guiding surface 113 is located between and connected to the first contact surface 111 and the second contact surface 112.

The tray 12 is slidably disposed on base 11 and located in the accommodating space 110. The tray 12 has a third engaging portion 122. The tray 12 is configured for bearing the workpiece 2. The tray 12 has a bearing surface 120 facing the workpiece 2. The bearing surface 120 may not in contact with the workpiece 2. In the base 11, the first contact surface 111 and the second contact surface 112 have a gap difference with respect to the bearing surface 120; that is, the distance between the first contact surface 111 and the bearing surface 120 is different from the distance between the second contact surface 112 and the bearing surface 120. The tray 12 is movable between a removed position and an inserted position with respect to the base 11. When the tray 12 is at the removed position, the tray 12 is relatively close to the opening end 110a. When the tray 12 is at the inserted position, the tray 12 is relatively away from the opening end 110a. The tray 12 is able to be moved from the removed position to the inserted position by being pushed by the workpiece 2. The elastic member 14 is connected to the base 11 and the tray 12. The elastic members 14 constantly force the tray 12 to move toward the removed position. In this embodiment, the elastic member 14 is, for example, a torsion spring, but the present disclosure is not limited thereto.

Each fastener 13 is movably disposed on tray 12. Each fastener 13 is able to be moved along the first contact surface 111, the guiding surface 113 and the second contact surface 112 by the movement of the tray 12. During the movement of the fasteners 13, a distance between each fastener 13 and the bearing surface 120 varies. The tray 12 has a protrusion 121. The fastener 13 has a through hole 131. The protrusion 121 penetrates through the through hole 131, and is able to be moved along the through hole 131. The elastic member 15 forces the fastener 13 to press against the first contact surface 111, the guiding surface 113 or the second contact surface 112.

In this embodiment, each fastener 13 is able to be moved with respect to the tray 12 in a direction (e.g. the z-direction shown in the drawings) which is parallel to a normal direction of the bearing surface 120 of the tray 12, but the present disclosure is not limited thereto. In some embodiments, each fastener may be moved with respect to the tray 12 in another direction (e.g. the y-direction shown in the drawings) which is orthogonal to the normal direction of the bearing surface 120 and the moving direction of the tray 12. In this embodiment, each fastener 13 has a second engaging portion 130. The second engaging portion 130 is, for example, in a hook shape, but the present disclosure is not limited thereto. In some embodiments, the second engaging portion may be a slot matching the shape of the first engaging portion. In this embodiment, the protrusion 121 may be changed according to actual requirements. In some embodiments, the protrusion may be a bolt additionally fixed on the tray 12. The elastic member 15 is connected to the fastener 13 and the tray 12. The elastic member 15 is, for example, an extension spring, but the present disclosure is not limited thereto.

The connection port 16 is disposed on the base 11. When the tray 12 is at the inserted position and the workpiece 2 is located on the tray 12, the connection port 16 is electrically connected to the workpiece 2.

Figure 4A:
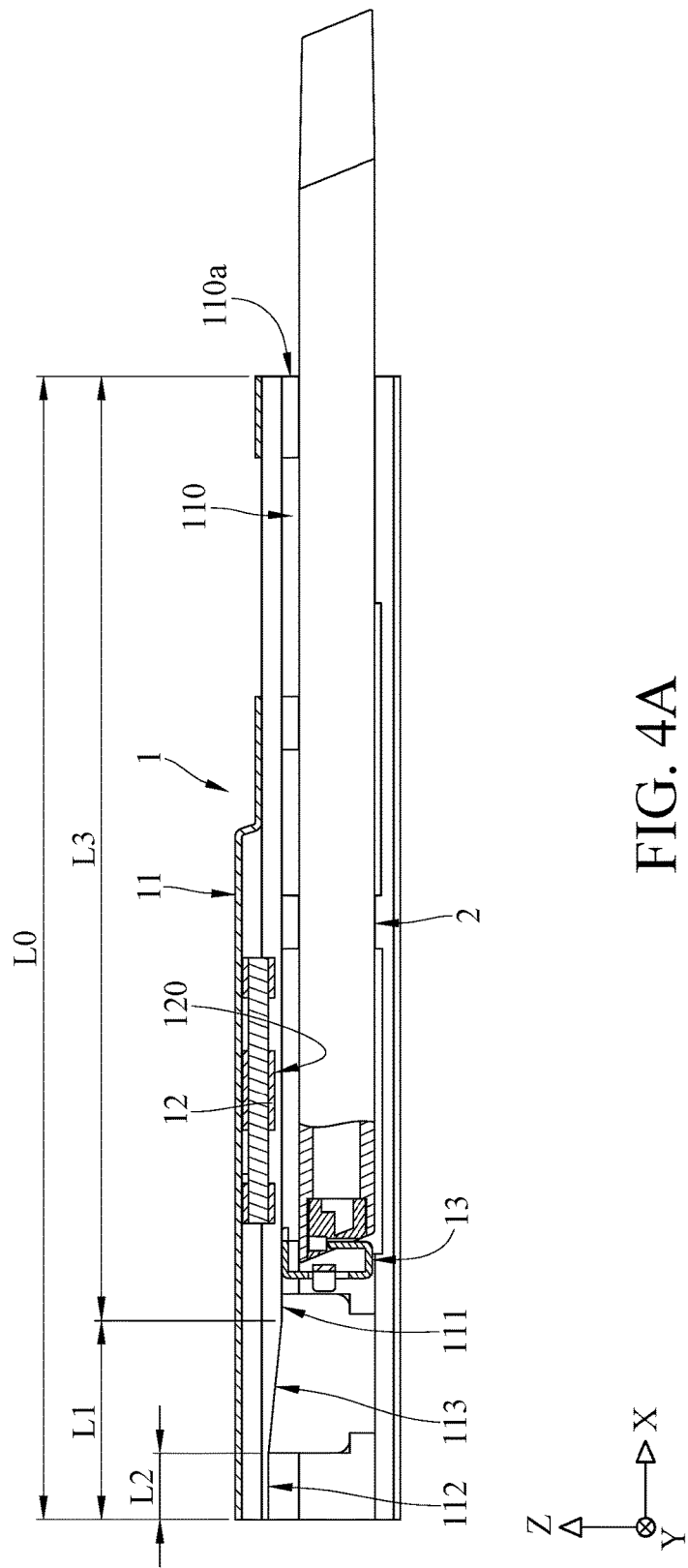
FIG. 4A is a cross-sectional view showing a state of the slot assembly and the workpiece in FIG. 1.
Figure 4B:
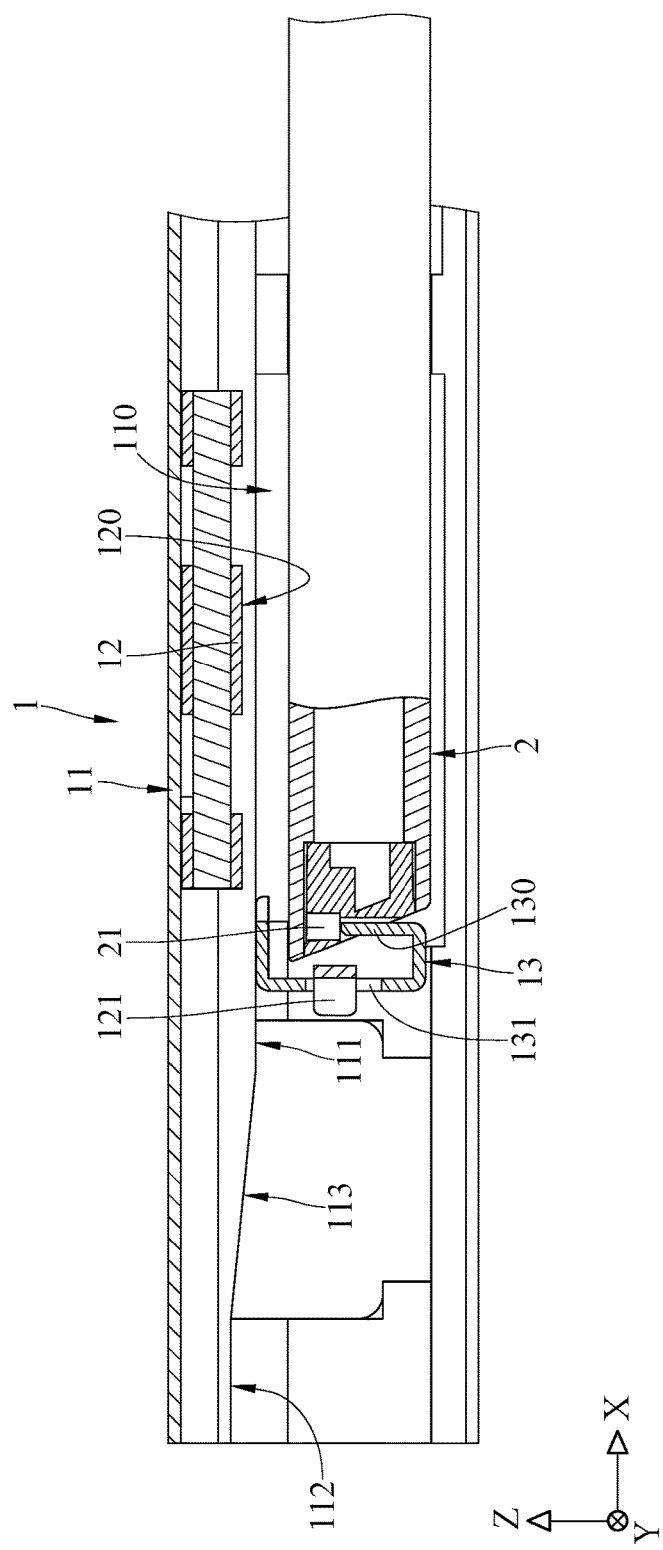
FIG. 4B is a partial enlarged view of the slot assembly and the workpiece in FIG. 4A.

Please refer to FIG. 4A and FIG. 4B, FIG. 4A is a cross-sectional view showing a state of the slot assembly 1 and the workpiece 2 in FIG. 1, FIG. 4B is a partial enlarged view of the slot assembly and the workpiece in FIG. 4A. In this embodiment, the first contact surface 111 is located between the guiding surface 113 and the opening end 110a. From the point of view of FIG. 4A, a total length L1 of an orthogonal projection of the guiding surface 113 and the second contact surface 112 onto the bearing surface 120 is about 20-35% of a length L0 of an orthogonal projection of the base 11 onto the bearing surface 120. A length L2 of an orthogonal projection of the second contact surface 112 onto the bearing surface 120 is about 10-12.5% of the length L0 of the orthogonal projection of the base 11 onto the bearing surface 120. A distance L3 between the opening end 110a and a join of the first contact surface 111 and guiding surface 113 is about 65-80% of the length L0.

Figure 5:
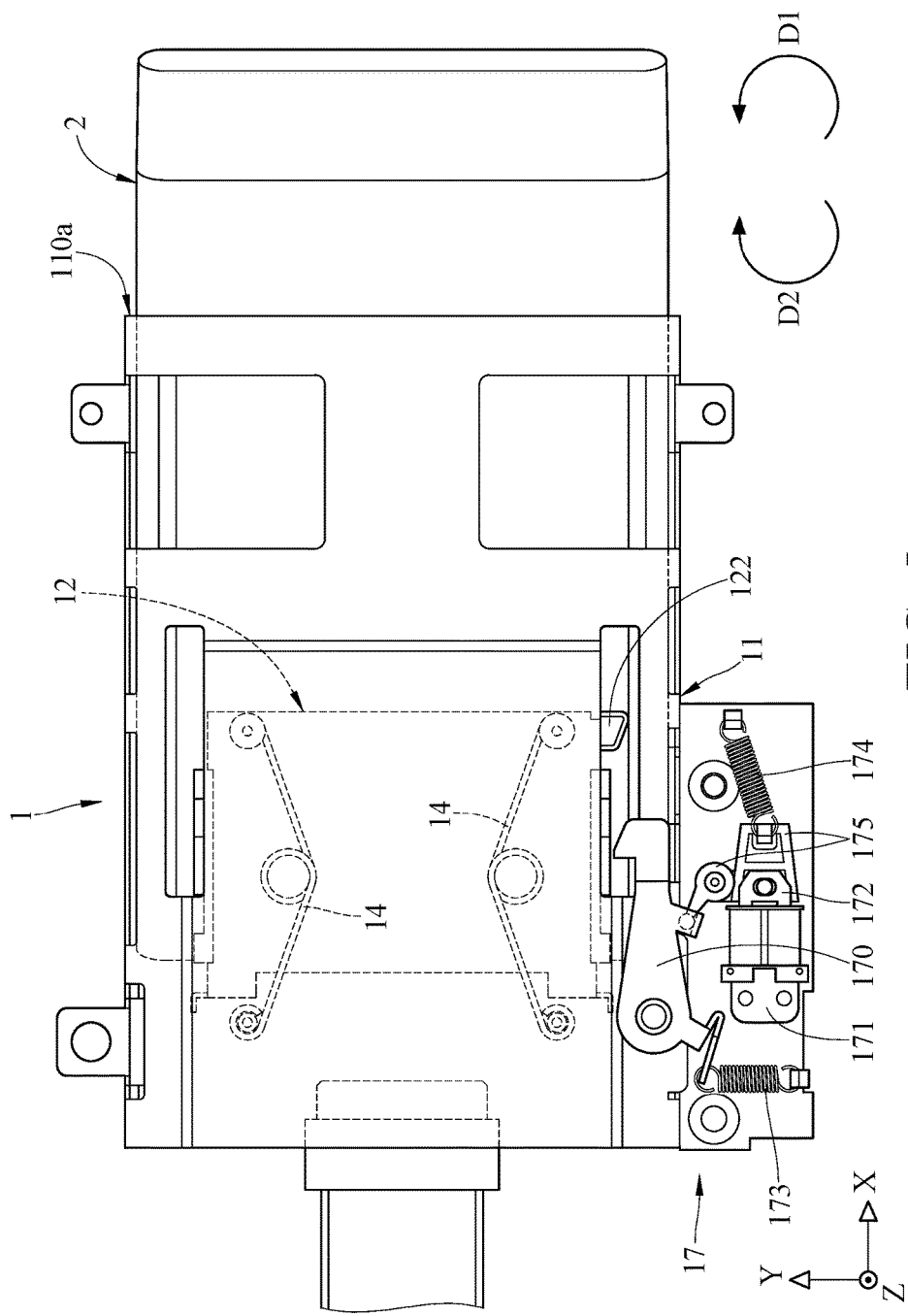
FIG. 5 is a top view of the slot assembly and the workpiece in FIG. 4A.

Please refer to FIG. 1, FIG. 2 and FIG. 5, FIG. 5 is a top view of the slot assembly and the workpiece in FIG. 4A. In this embodiment, the switch mechanism 17 is disposed on the base 11. The switch mechanism 17 includes a fourth engaging portion 170, a first magnetic member 171, a second magnetic member 172, a first elastic member 173, a second elastic member 174 and a pivotal member 175. The switch mechanism 17 is able to be shifted between a turn-on position and a turn-off position. The fourth engaging portion 170 is engaged with the third engaging portion 122 of the tray 12 when the switch mechanism 17 is at the turn-off position, and the fourth engaging portion 170 is not engaged with the third engaging portion 122 when the switch mechanism 17 is at the turn-on position.

In detail, in this embodiment, the first magnetic member 171 is fixed to the base 11. The fourth engaging portion 170 and the pivotal member 175 are pivoted to the base 11. Two ends of the first elastic member 173 are respectively hooked to the base 11 and the fourth engaging portion 170. Two ends of the second elastic member 174 are respectively hooked to the base 11 and the pivotal member 175. The second magnetic member 172 is pivoted to the pivotal member 175.

The pivotal member 175 is pressed against the fourth engaging portion 170. The first magnetic member 171 and the second magnetic member 172 jointly form a reed switch.

In this embodiment, the second elastic member 174 is able to force the pivotal member 175 to rotate in a first rotational direction D1. When the pivotal member 175 is rotated in the first rotational direction D1, the pivotal member 175 pushes the fourth engaging portion 170, and the fourth engaging portion 170 is rotated in a second rotational direction D2 which is different from the first rotational direction D1. In addition, the first elastic member 173 is able to drive the fourth engaging portion 170 to rotate in the first rotational direction D1.

Please refer to FIG. 4A, FIG. 4B and FIG. 5, wherein the user is able to insert the workpiece 2 into the accommodating space 110 through the opening end 110a. When the fastener 13 is not pushed by the workpiece 2 yet, the tray 12 is at the removed position, and the fastener 13 is at the released position with respect to the tray 12. The fastener 13 presses against the first contact surface 111, so the second engaging portion 130 is relatively away from the bearing surface 120. Therefore, the second engaging portion 130 is detached from the first engaging portion 21 of the workpiece 2. The protrusion 121 of the tray 12 is located at a side of the through hole 131 of the fastener 13.

In such a case, the first magnetic member 171 and the second magnetic member 172 magnetically attract each other, and the magnetic attraction force between the first magnetic member 171 and the second magnetic member 172 is able to resist the elastic force of the second elastic member 174 in order to prevent the pivotal member 175 from rotating. The first elastic member 173 forces the fourth engaging portion 170 to rotate in the first rotational direction D1 until the fourth engaging portion 170 presses against the pivotal member 175. In such a case, the fourth engaging portion 170 is at the turn-off position, and the fourth engaging portion 170 is engaged with the third engaging portion 122.

When the workpiece 2 is further inserted into the accommodating space 110 to push the tray 12 from the removed position toward the inserted position, the fastener 13 is moved from the first contact surface 111 toward the second contact surface 112 through the guide of the guiding surface 113 so that the fastener 13 is moved from the released position toward the fixed position. The protrusion 121 of the tray 12 is moved toward another side of the through hole 131 of the fastener 13. When the third engaging portion 122 of the tray 12 is in contact with the fourth engaging portion 170 of the switch mechanism 17, the third engaging portion 122 pushes the fourth engaging portion 170 to rotate to the turn-on position in the second rotational direction D2. In such a case, the pivotal member 175 is not pushed by the fourth engaging portion 170.

Figure 6A:
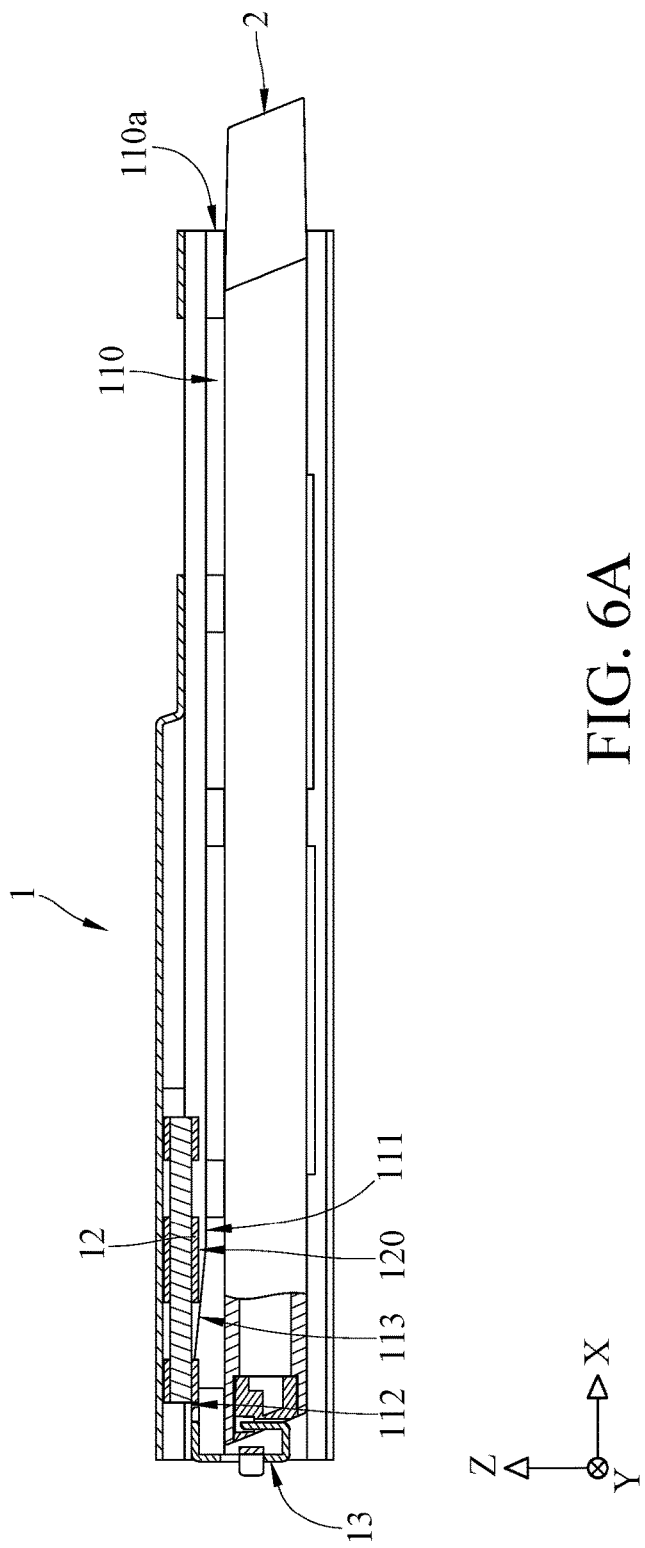
FIG. 6A is a cross-sectional view showing another state of the slot assembly and the workpiece in FIG. 1.
Figure 6B:
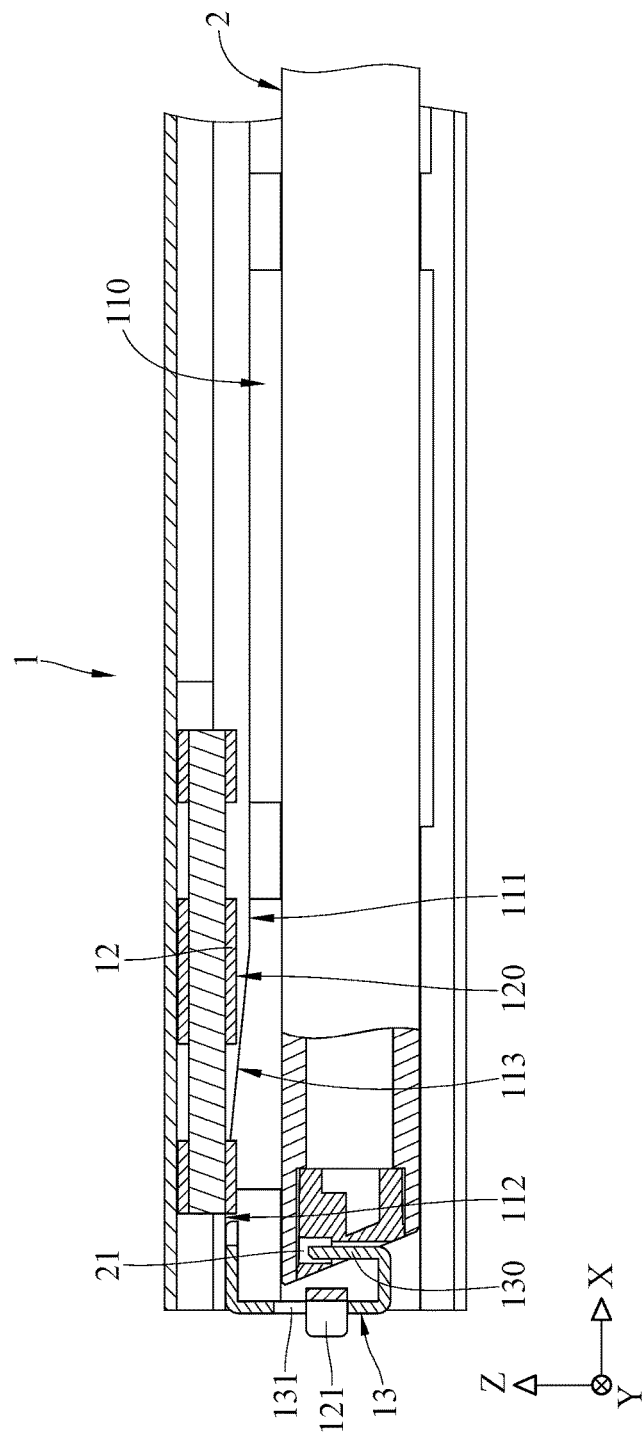
FIG. 6B is a partial enlarged view of the slot assembly and the workpiece in FIG. 6A.
Figure 7:
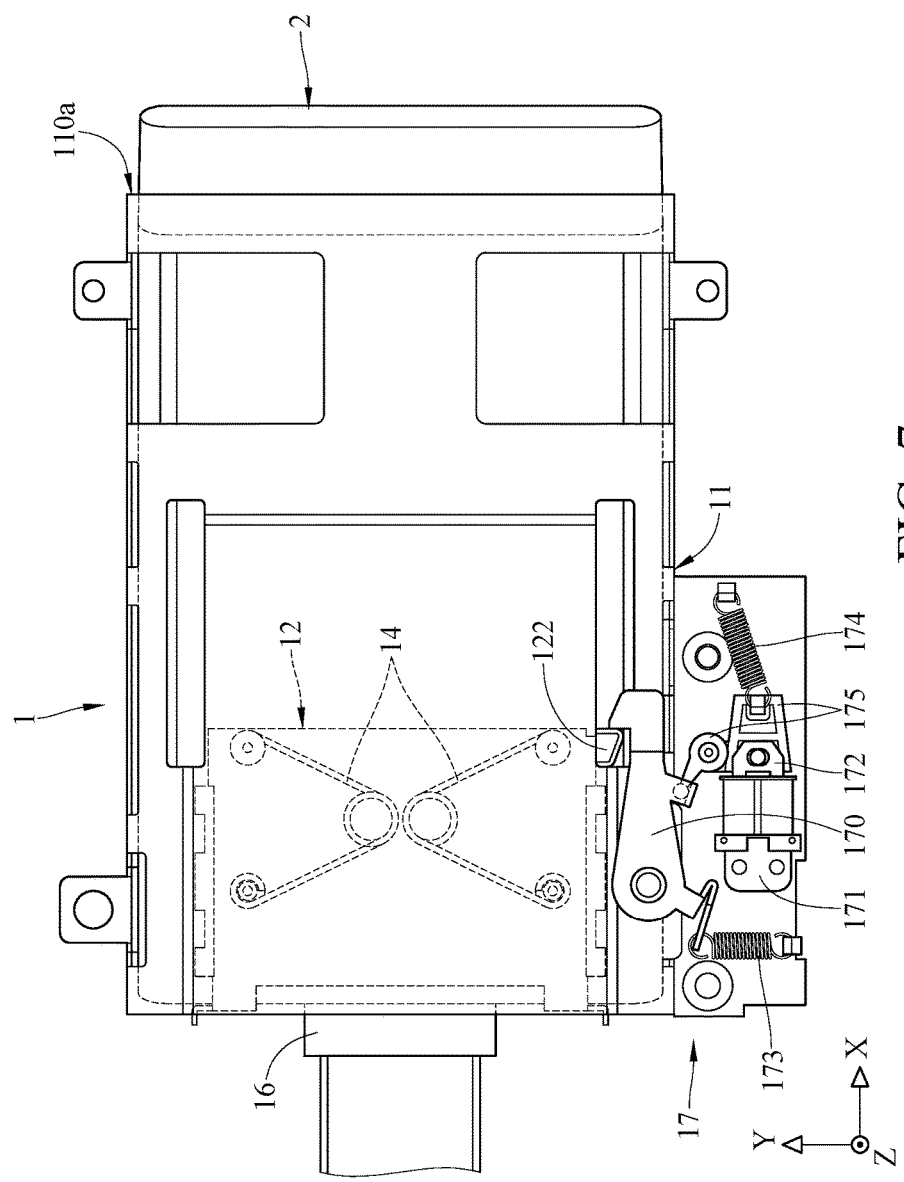
FIG. 7 is a top view of the slot assembly and the workpiece in FIG. 6A.

Please refer to FIG. 6A, FIG. 6B and FIG. 7, FIG. 6A is a cross-sectional view showing another state of the slot assembly and the workpiece in FIG. 1, FIG. 6B is a partial enlarged view of the slot assembly and the workpiece in FIG. 6A, and FIG. 7 is a top view of the slot assembly and the workpiece in FIG. 6A.

As shown in FIG. 6A and FIG. 6B, the workpiece 2 is inserted into the accommodating space 110 via the opening end 110a. The workpiece 2 pushes the fastener 13 in order to move the tray 12 to the inserted position. When the tray 12 is at the inserted position, the fastener 13 is at the fixed position with respect to the tray 12. In such a case, the fastener 13 is pressed against the second contact surface 112 so that the second engaging portion 130 is relatively close to the bearing surface 120 and fixed to the first engaging portion 21. Also, the hook shaped second engaging portion 130 is hooked to the slot shaped first engaging portion 21.

As shown in FIG. 7, when the workpiece 2 is inserted into the accommodating space 110 to be electrically connected to the connection port 16, the tray 12 is kept pressed by the workpiece 2 in order to deform the elastic members 14 connected to the tray 12 and the base 11. Also, when the third engaging portion 122 of the tray 12 moves over the fourth engaging portion 170 of the switch mechanism 17 (that is, when the fourth engaging portion 170 is located between the opening end 110a and the third engaging portion 122), the first magnetic member 171 and the second magnetic member 172 magnetically attract with each other, and the magnetic attraction force between the first magnetic member 171 and the second magnetic member 172 is strong enough to resist the elastic force of the second elastic member 174. The first elastic member 173 is able to drive the fourth engaging portion 170 to rotate in the first rotational direction D1 until the fourth engaging portion 170 is pressed against the pivotal member 175. The third engaging portion 122 and the fourth engaging portion 170 are engaged with each other so that the fourth engaging portion 170 is maintained at the turn-off position, and the third engaging portion 122 and the fourth engaging portion 170 are fixed to each other.

As shown in FIG. 6B and FIG. 7, since the third engaging portion 122 and the fourth engaging portion 170 are fixed to each other, the tray 12 is maintained at the inserted position, and the fastener 13 is at the fixed position, when the user lets go of the workpiece 2. The second engaging portion 130 of the fastener 13 is kept fixed to the first engaging portion 21 of the workpiece 2. Thus, when the workpiece 2 is accommodated in the accommodating space 110 of the base 11, the workpiece 2 is firmly fixed inside the electronic device by the engagement of the second engaging portion 130 of the fastener 13 and the first engaging portion 21 of the workpiece 2. Accordingly, the workpiece 2 is fixed in place, and the workpiece 2 is prevented from sliding out from the base 11 in order to maintain the electrical connection between the workpiece 2 and the connection port 16. Also, the connection port 16 is prevented from being damaged.

Figure 8:
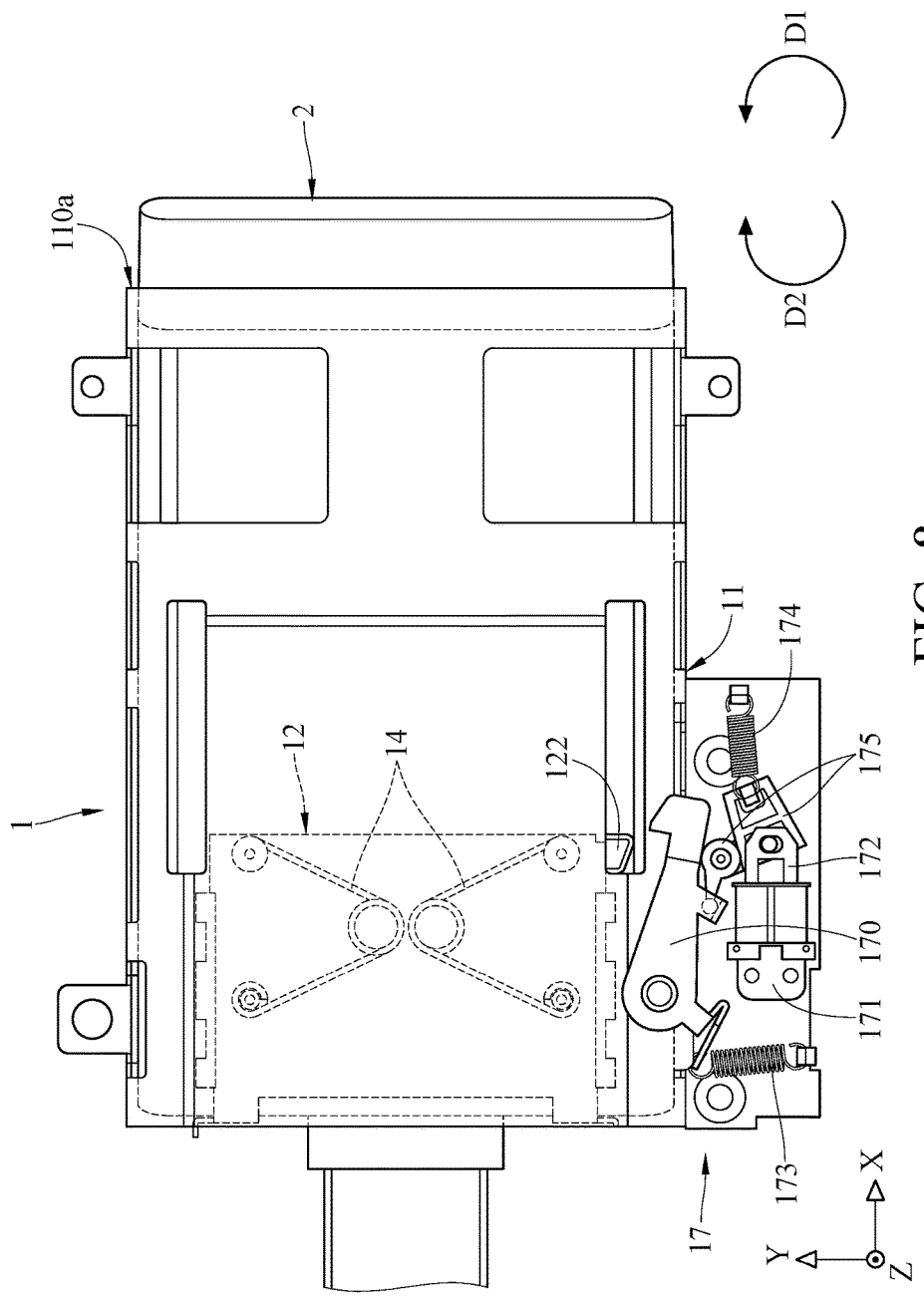
FIG. 8 and FIG. 9 show the operation of the slot assembly in FIG. 1.
Figure 9:
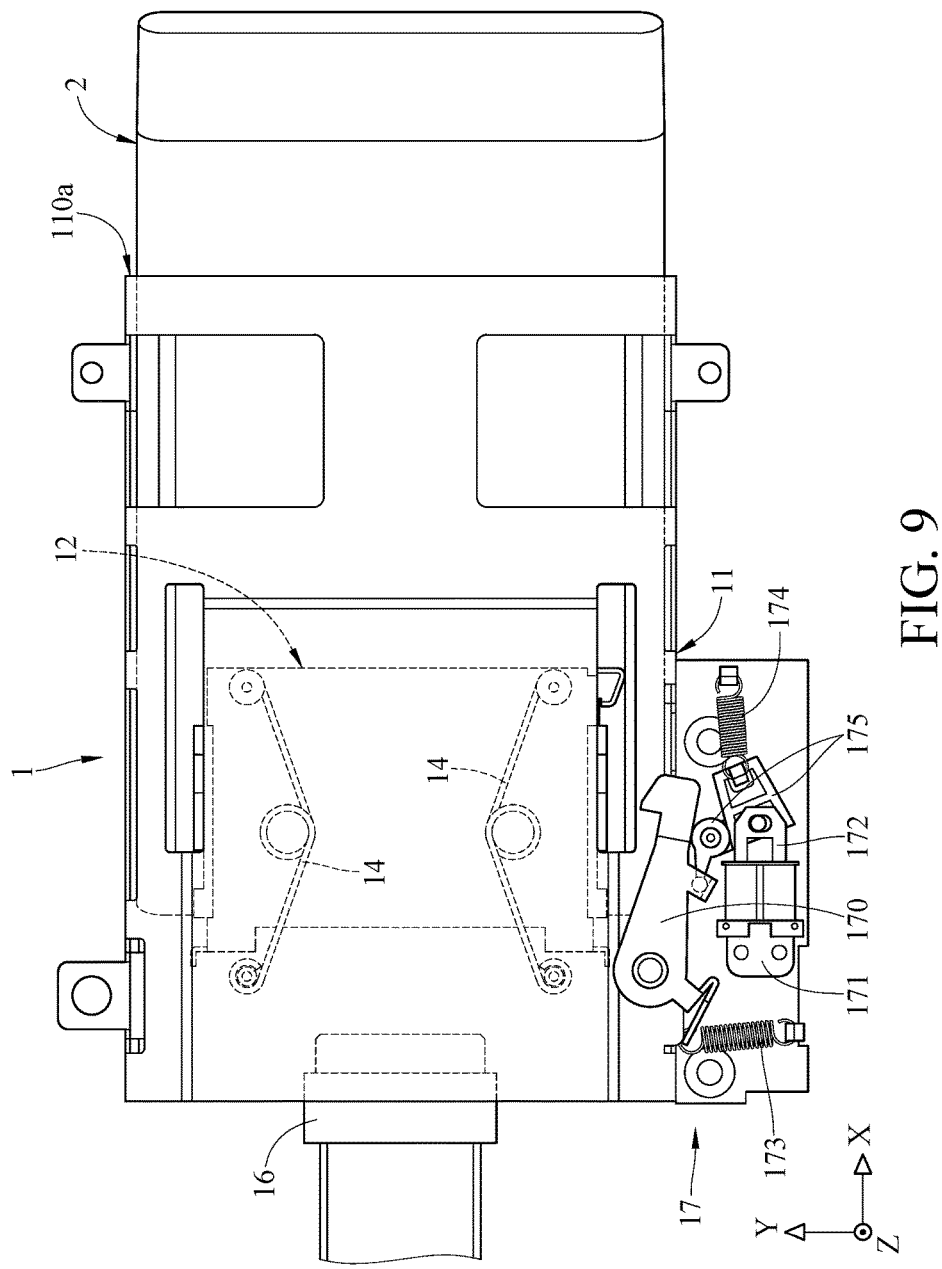

Please refer to FIG. 8 and FIG. 9, FIG. 8 and FIG. 9 show the operation of the slot assembly 1 in FIG. 1. As shown in FIG. 8, when the workpiece is about to be taken out from the base 11, the magnetic attraction force between the first magnetic member 171 and the second magnetic member 172 is removed. In such a case, a restoring force of the second elastic member 174 drives the pivotal member 175 to rotate in the first rotational direction D1, and the pivotal member 175 pushes the fourth engaging portion 170. The force of the pivotal member 175 and a restoring force of the first elastic member 173 drive the fourth engaging portion 170 to rotate in the second rotational direction D2, and the fourth engaging portion 170 is rotated to the turn-on position. Therefore, the fourth engaging portion 170 and the third engaging portion 122 are not engaged with each other. Also, the elastic member 14 located between the tray 12 and the base 11 provides a restoring force in order to drive the tray 12 to move toward the opening end 110a to the removed position, as shown in FIG. 9, the workpiece 2 is moved with the tray 12 and disconnected with the connection port 16. In addition, as shown in FIG. 4B, the fastener 13 is able to be moved from the second contact surface 112 to the first contact surface 111 though the guiding surface 113 so as to be moved from the fixed position to the released position. Thus, the second engaging portion 130 of the fastener 13 is detached from the first engaging portion 21 of the workpiece 2, and then the workpiece 2 is able to be taken out from the slot assembly 1.

The present disclosure is not limited to the numbers of the first contact surfaces 111, the guiding surfaces 113, the second contact surfaces 112, the protrusions 121 of the tray 12, the fasteners 13, the elastic members 14 and the elastic members 15. In some embodiments, each of the numbers may be over three or only one.

Figure 10:
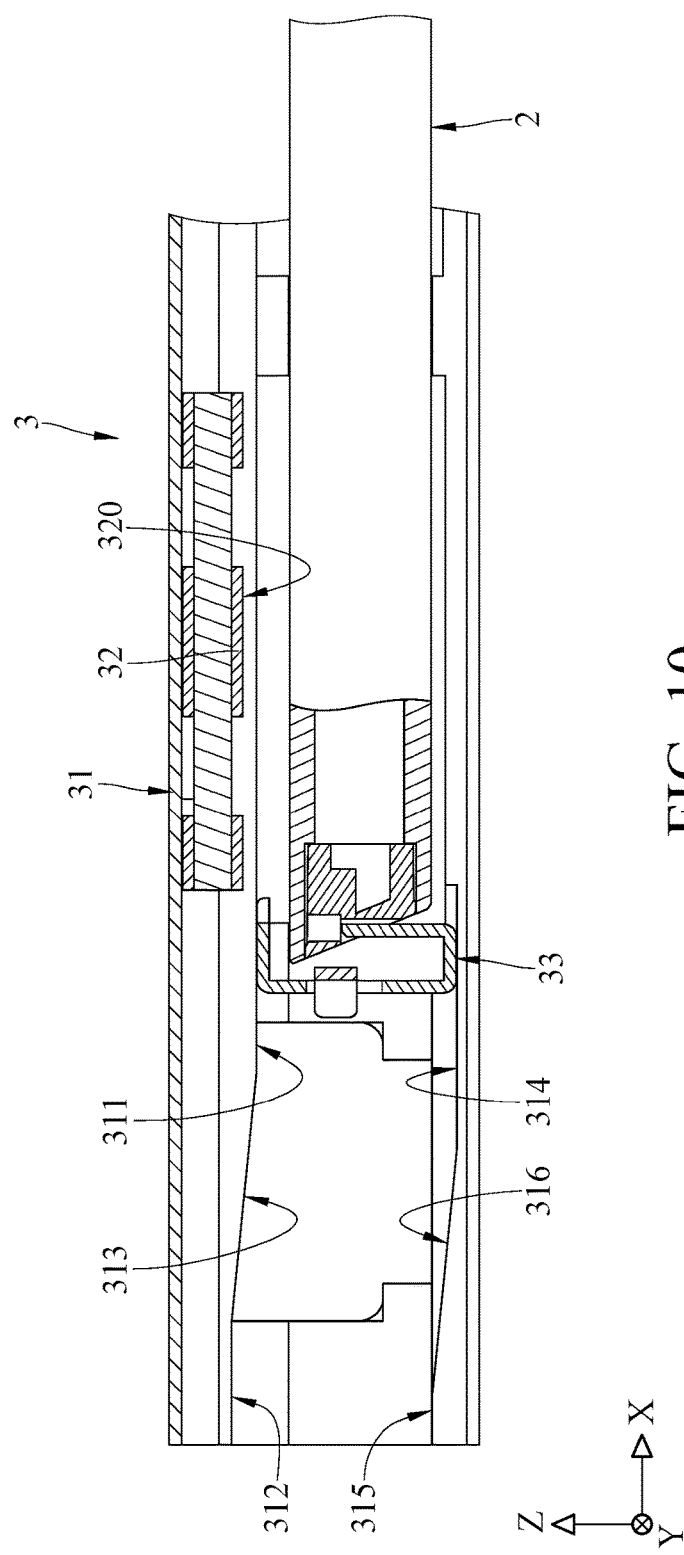
FIG. 10 is a partial cross-sectional side view of a slot assembly and a workpiece according to another embodiment of the disclosure showing that a tray of the slot assembly is at a removed position.
Figure 11:
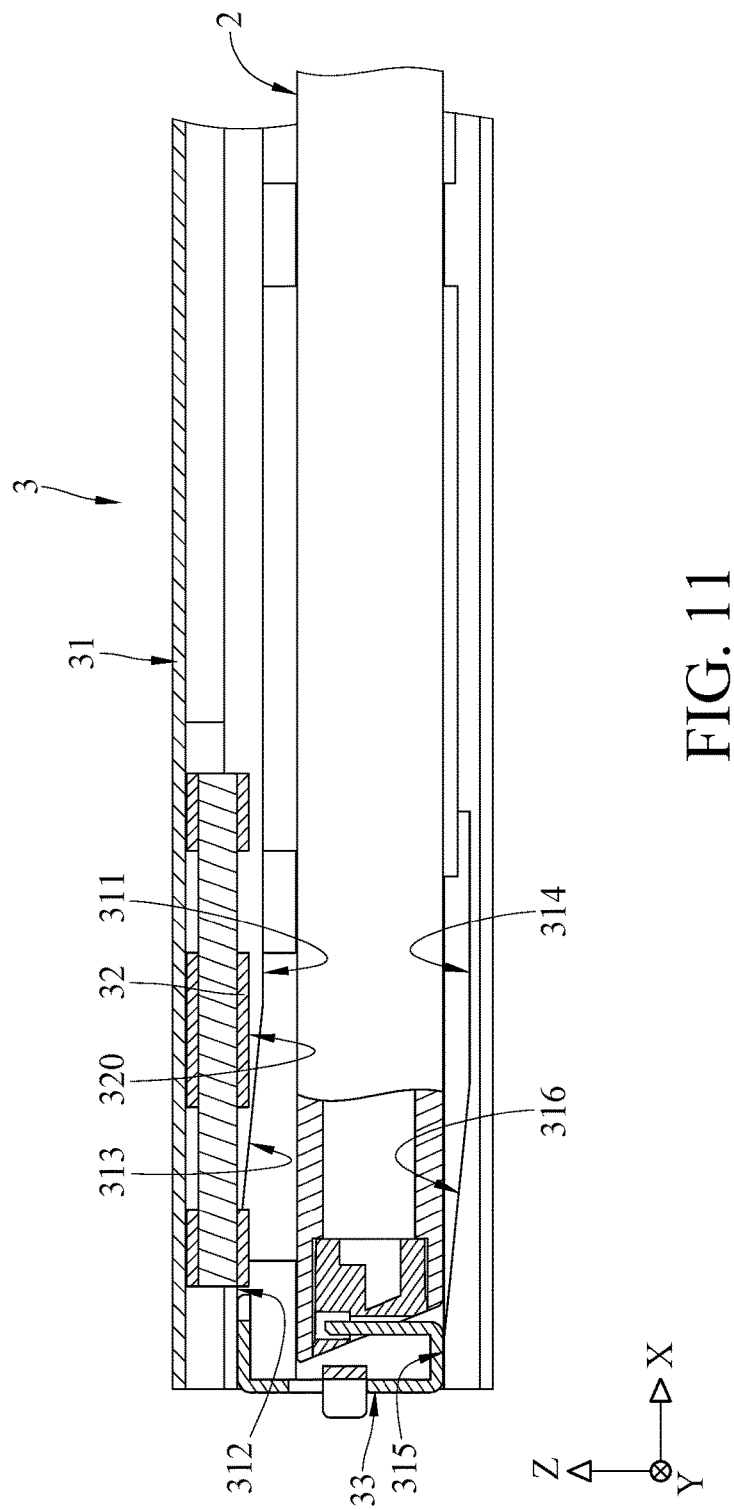
FIG. 11 is a partial cross-sectional side view showing that the tray of the slot assembly in FIG. 10 is at an inserted position.

Please refer to FIG. 10 and FIG. 11, FIG. 10 is a partial cross-sectional side view of a slot assembly and a workpiece according to another embodiment of the disclosure showing that a tray of the slot assembly is at a removed position, FIG. 11 is a partial cross-sectional side view showing that the tray of the slot assembly in FIG. 10 is at an inserted position. In this embodiment, the slot assembly 3 is similar to the slot assembly 1 in FIG. 4B, the differences therebetween are that a base 31 of the slot assembly 3 has a first contact surface 311, a first guiding surface 313, a second contact surface 312, a third contact surface 314, a second guiding surface 316 and a fourth contact surface 315. The first contact surface 311 and the second contact surface 312 have a gap difference with respect to a bearing surface 320 of a tray 32. The first guiding surface 313 is connected to the first contact surface 311 and the second contact surface 312. The third contact surface 314 and the fourth contact surface 315 also have a gap difference with respect to the bearing surface 320 of the tray 32. The second guiding surface 316 is connected to the third contact surface 314 and the fourth contact surface 315.

The third contact surface 314 faces the first contact surface 311, the fourth contact surface 315 faces the second contact surface 312, the second guiding surface 316 faces the first guiding surface 313. The fastener 33 is located between the first contact surface 311 and the third contact surface 314, the first guiding surface 313 and the second guiding surface 316, or the second contact surface 312 and the fourth contact surface 315. With the movement of the tray 32, the fastener 33 is movable among a place between the first contact surface 311 and the third contact surface 314, a place between the first guiding surface 313 and the second guiding surface 316, and a place between the second contact surface 312 and the fourth contact surface 315 so that a distance between the fastener 33 and the bearing surface 320 varies when the fastener 33 is moved with the tray 32.

As shown in FIG. 10, when the tray 32 is at the removed position, the fastener 33 is located between the first contact surface 311 and the third contact surface 314, and the fastener 33 is at the released position with respect to the tray 32.

When the tray 32 is slid from the removed position to the inserted position, the fastener 33 located between the first contact surface 311 and the third contact surface 314 is guided by the first guiding surface 313 and the second guiding surface 316 so as to be moved toward a position between the second contact surface 312 and the fourth contact surface 315, and the fastener 33 is moved from the released position to the fixed position.

As shown in FIG. 11, when the tray 32 is at the inserted position, the fastener 33 is located between the second contact surface 312 and the fourth contact surface 315, and the fastener 33 is at the fixed position with respect to the tray 32.

When the tray 32 is slid from the inserted position to the removed position, the fastener 33 located between the second contact surface 312 and the fourth contact surface 315 is guided by the first guiding surface 313 and the second contact surface 316 so as to be moved toward a position between the first contact surface 311 and the third contact surface 314, and the fastener 33 is moved from the fixed position to the released position.

In some cases, some of the features in each embodiment may be combined together or interchanged, and the said cases fall within the scope of the present disclosure.

According to the slot assembly and workpiece as discussed above, the workpiece is fixed in place when the tray is pushed to the inserted position because the first engaging portion and the second engaging portion are fixed to each other. When an external force is applied on the slot assembly of an electronic device or the workpiece, the electrical connection between the workpiece and the electronic device is maintained in a stable condition, and the workpiece is prevented from sliding out from the electronic device. In addition, the workpiece is fixed in place and not moved unexpectedly, so a connection port electrically connected to the workpiece is prevented from being damaged.

In addition, when the tray is moved from the removed position toward the inserted position, the fastener is moved from the released position toward the fixed position by the guide of the guiding surface. Or, when the tray is moved from the inserted position toward the removed position, the fastener is moved from the fixed position toward the released position by the guide of the guiding surface. Therefore, during the insertion and the removal of the workpiece, it is easy to drive the fastener to fix or release the workpiece without additional operation. It is convenient to insert the workpiece into the electronic device or remove the workpiece from the electronic device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A slot assembly, configured to be inserted by a workpiece, the workpiece having a first engaging portion, the slot assembly comprising:

a base having an accommodating space, the accommodating space having an opening end, the workpiece configured to be inserted into or removed from the accommodating space through the opening end;

a tray movably disposed on the base and located in the accommodating space, the tray having a bearing surface for bearing the workpiece, the tray being movable between a removed position and an inserted position, the tray relatively close to the opening end when the tray is at the removed position, the tray relatively away from the opening end when the tray is at the inserted position, the tray being moved from the removed position to the inserted position by being pushed by the workpiece; and a fastener movably disposed on the tray, the fastener having a second engaging portion; wherein when the tray is at the removed position, the fastener is at a released position, and the second engaging portion of the fastener is located away from the bearing surface with respect to the tray and detached from the first engaging portion; when the tray is at the inserted position, the fastener is at a fixed position, and the second engaging portion of the fastener is located close to the bearing surface with respect to the tray and fixed to the first engaging portion.

2. The slot assembly according to claim 1, wherein the base has a first contact surface, a first guiding surface and a second contact surface, the first contact surface and the second contact surface have a gap difference with respect to the bearing surface, the first guiding surface is connected to the first contact surface and the second contact surface, a distance between the fastener and the bearing surface varies while the fastener is moved along the first contact surface, the first guiding surface and the second contact surface by movement of the tray; when the tray is at the removed position, the fastener is pressed against the first contact surface and at the released position with respect to the tray; when the tray is at the inserted position, the fastener is pressed against the second contact surface and at the fixed position with respect to the tray; when the tray is moved from the removed position to the inserted position, the fastener is moved to the second contact surface from the first contact surface through the first guiding surface so as to be moved from the released position to the fixed position; when the tray is moved from the inserted position to the removed position, the fastener is moved to the first contact surface from the second contact surface through the first guiding surface so as to be moved from the fixed position to the released position.

3. The slot assembly according to claim 2, further comprising an elastic member connected to the fastener and the tray, and the elastic member forcing the fastener to press against the first contact surface, the first guiding surface or the second contact surface.

4. The slot assembly according to claim 2, wherein the base further has a third contact surface, a second guiding surface and a fourth contact surface, the third contact surface faces the first contact surface, the fourth contact surface faces the second contact surface, the second guiding surface faces the first guiding surface, and the fastener is located between the first contact surface and the third contact surface, the first guiding surface and the second guiding surface, or the second contact surface and the fourth contact surface; the third contact surface and the fourth contact surface have a gap difference with respect to the bearing surface, the second guiding surface is connected to the third contact surface and the fourth contact surface, a distance between the fastener and the bearing surface varies while the fastener is moved along the third contact surface, the second guiding surface and the fourth contact surface by movement of the tray; when the tray is at the removed position, the fastener is located between the first contact surface and the third contact surface and at the released position with respect to the tray; when the tray at the inserted position, the fastener is located at the second contact surface and the fourth contact surface and at the fixed position with respect to the tray; when the tray is moved from the removed position to the inserted position, the fastener is moved from a place between the first contact surface and the third contact surface to a place between the second contact surface and the fourth contact surface through guide of the first guiding surface and the second guiding surface so as to be moved from the released position to the fixed position; when the tray is moved from the inserted position to the removed position, the fastener is moved from the place between the second contact surface and the fourth contact surface to the place between the first contact surface and the third contact surface through guide of the first guiding surface and the second contact surface so as to be moved from the fixed position to the released position.

5. The slot assembly according to claim 2, wherein the first contact surface is located between the first guiding surface and the opening end, a total length of an orthogonal projection of the first guiding surface and the second contact surface onto the bearing surface is 20-35% of a length of an orthogonal projection of the base onto the bearing surface.

6. The slot assembly according to claim 2, wherein a length of an orthogonal projection of the second contact surface onto the bearing surface is 10-12.5% of a length of an orthogonal projection of the base onto the bearing surface.

7. The slot assembly according to claim 2, wherein a distance between the opening end and a join of the first contact surface and the first guiding surface is 65-80% of a length of an orthogonal projection of the base onto the bearing surface.

8. The slot assembly according to claim 1, wherein the tray has a protrusion, the fastener has a through hole, the protrusion penetrates through the through hole, and the protrusion is movable in the through hole.

9. The slot assembly according to claim 1, wherein the first engaging portion is a recess, the second engaging portion is a hook, when the fastener is at the fixed position, the hook is hooked to the recess.

10. The slot assembly according to claim 1, further comprising an elastic member connected to the base and the tray, the elastic member constantly forcing the tray to move toward the removed position.

11. The slot assembly according to claim 1, further comprising a connection port disposed on the base, wherein when the tray is at the inserted position and the workpiece is disposed on the tray, the connection port is electrical connected to the workpiece.

12. The slot assembly according to claim 1, further comprising a switch mechanism disposed on the base, the tray having a third engaging portion, the switch mechanism having a fourth engaging portion, the fourth engaging portion being movable between a turn-on position and a turn-off position; wherein when the fourth engaging portion is at the turn-off position, the fourth engaging portion is engaged with the third engaging portion; when the fourth engaging portion is at the turn-on position, the fourth engaging portion is not engaged with the third engaging portion.

13. The slot assembly according to claim 12, wherein the switch mechanism further comprises a first magnetic member, a second magnetic member, a first elastic member, a second elastic member and a pivotal member, the first magnetic member is fixed to the base, the fourth engaging portion and the pivotal member are pivoted to the base, two ends of the first elastic member are respectively hooked to the base and the fourth engaging portion, two ends of the second elastic member are respectively hooked to the base and the pivotal member, the second magnetic member is pivoted to the pivotal member, the pivotal member is pressed against the fourth engaging portion; when the first magnetic member and the second magnetic member magnetically attract each other, the fourth engaging portion is at the turn-off position; when magnetic attraction force between the first magnetic member and the second magnetic member is removed, the second elastic member drives the pivotal member to rotate in a first rotational direction, the pivotal member and the first elastic member drive the fourth engaging portion to rotate in a second rotational direction which is different from the first rotational direction, in order to rotate the fourth engaging portion to the turn-on position.

14. A workpiece, having a first surface, a second surface parallel to the first surface, a side surface inclined with respect to the first surface and the second surface, and an engaging portion, wherein the engaging portion is a recess located on the side surface.

* * * * *